(12) United States Patent
Edenhofer et al.

(10) Patent No.: US 6,729,907 B1
(45) Date of Patent: May 4, 2004

(54) PLUG-IN CONNECTOR FOR AN ELECTRICAL DEVICE

(75) Inventors: Johannes Edenhofer, Regensburg (DE); Kurt Stimpfl, Wolfsegg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/667,281

(22) Filed: Sep. 22, 2000

(30) Foreign Application Priority Data

Sep. 22, 1999 (DE) .......................................... 199 45 426

(51) Int. Cl.⁷ .............................................. H01R 13/66
(52) U.S. Cl. .......................... 439/620; 439/79; 439/181
(58) Field of Search .......................... 439/620, 79, 181

(56) References Cited

U.S. PATENT DOCUMENTS

| | | | |
|---|---|---|---|
| 3,264,599 A | * 8/1966 | Kinkaid | 439/374 |
| 3,982,157 A | * 9/1976 | Azuma et al. | 361/215 |
| 4,326,960 A | * 4/1982 | Iwahori et al. | 210/650 |
| 4,999,595 A | * 3/1991 | Azumi et al. | 439/607 |
| 5,161,991 A | 11/1992 | Bauer | |
| 5,181,864 A | * 1/1993 | Wakino et al. | 439/620 |
| 5,215,474 A | 6/1993 | Rotella | |
| 5,280,467 A | * 1/1994 | Wanger et al. | 369/275.5 |
| 5,340,641 A | 8/1994 | Xu | |
| 5,475,477 A | * 12/1995 | Tanuma et al. | 399/259 |
| 5,484,838 A | * 1/1996 | Helms et al. | 524/496 |

FOREIGN PATENT DOCUMENTS

| | | |
|---|---|---|
| FR | 2 726 941 | 5/1996 |
| WO | WO 96/02922 A2 | 2/1996 |

OTHER PUBLICATIONS

H.J. Mair et al.: "Elektrisch leitende Kunststoffe", Carl Hanser Verlag München, Wien, Library of the German Patent Office ["Electrically conducting plastic materials"] Jun. 1987.

* cited by examiner

*Primary Examiner*—Tho D. Ta
(74) *Attorney, Agent, or Firm*—Laurence A. Greenberg; Werner H. Stemer; Gregory L. Mayback

(57) ABSTRACT

A plug-in connector for an electrical device has a plastic member which includes a material that has conductive properties at voltages above a given working voltage range and has insulating properties at voltages in the given working voltage range. Contact pins are embedded in the plastic member. The voltage-dependent conductivity protects the electrical device against electrostatic discharges.

10 Claims, 2 Drawing Sheets

PLUG-IN CONNECTOR FOR AN ELECTRICAL DEVICE

BACKGROUND OF THE INVENTION

Field of the Invention

The invention relates to a plug-in connector of an electrical device with contact pins which are embedded in a plastic member.

Electrostatic discharges can occur when packaging, handling or connecting electrical devices, for example control devices for motor vehicles. In order to prevent damage to sensitive electronic components by electrostatic discharges, components such as capacitors, coils or varistors which are relatively expensive and require installation space are frequently provided for each contact pin of a plug-in connector.

Published Non-Prosecuted Patent Application DE 43 26 486 A1 discloses a filter plug with a block body which is produced from a mixture of insulating material and ferrite powder for the purpose of suppressing radio-frequency interference.

The application of electrically conductive plastics to avoid electrostatic charging of housings is known from the document "Elektrisch leitende Kunststoffe" ["Electrically Conducting Plastics"], Carl Hanser Publishers, Munich, Vienna, published by H. J. Mair and S. Roth, page 10. Such a housing consists of a mixture of plastic and carbon black, and is intended to have a surface resistance of less than $10^9$ Ohms.

European Patent Application EP 0 649 150 A1 relates to a composite material which has a filler and a matrix embedding the filler. The filler contains predominantly one component with particles having a core/shell structure. The shells of the particles having a core/shell structure are made from insulating material, whereas the cores of these particles consist of electrically conducting or electrically semiconducting material. Under specific preconditions and with a suitable selection of the material of the cores, the electric conductivity of this composite material can change nonlinearly twice under the influence of an electric field. The first nonlinear change effects a voltage limitation, the second a current limitation.

Published Non-Prosecuted Patent Application DE 37 02 780 A1 describes a carrier for a semiconductor component. A varistor protection device protecting against the effects of electromagnetic fields or static charges is integrated into the carrier. The connections of the semiconductor component to be protected are connected to one another by a sandwich structure. The sandwich structure has a first layer made from a varistor material, a first electrode connected to a given potential, a second layer made from varistor material and a second electrode connected to ground.

U.S. Pat. No. 5,616,881 discloses a base for an igniter of an airbag which has two chambers. Provided in the first chamber is an insert with two plug-in pins and a metal oxide varistor for protecting an igniting device against electrostatic discharge.

SUMMARY OF THE INVENTION

It is accordingly an object of the invention to provide a plug-in connector for an electrical device which overcomes the above-mentioned disadvantages of the heretofore-known plug-in connectors of this general type and which provides protection against electrostatic discharge and is particularly easy to manufacture in terms of production engineering and requires no additional installation space for the protection against electrostatic discharge.

With the foregoing and other objects in view there is provided, in accordance with the invention, a plug-in connector for an electrical device, having:
 a plastic member including a material having conductive properties at voltages above a given working voltage range and having insulating properties at voltages in the given working voltage range; and
 contact pins embedded in the plastic member.

In accordance with another feature of the invention, the material is disposed in a form-fitting manner around the contact pins, the plastic member has a conducting surface, and the conducting surface electrically contacts the material and is disposed at a respective spacing distance from the contact pins.

In accordance with yet another feature of the invention, the material is a varistor material.

In accordance with a further feature of the invention, the material is a mixture of a plastic and carbon powder.

In accordance with yet a further feature of the invention, the plastic member includes a base material, and the material is a mixture of the base material and carbon powder.

In accordance with another feature of the invention, the material includes between 5 and 15 percent by weight of carbon powder.

In accordance with yet another feature of the invention, the plastic member includes a crystalline component and a noncrystalline component.

In order to avoid electrostatic discharges which put components at risk, the plastic member of the plug-in connector is provided with a material which has conducting properties at voltages in a range between 20 volts and 700 volts. As a result, a harmful electrostatic discharge or a touch current or contact current can be discharged over at least one contact pin of the plug-in connector and over the material which is conducting at a high voltage, such that an excessively high flow of current via the components at risk is avoided. In this case, the electrostatic charge can flow off from the contact pin via the conducting material onto a conducting surface and/or via other contact pins of the plug-in connector which are connected to a ground potential or frame potential.

The conducting properties of the material should be present at voltages which are only slightly above the working voltage defined for the plug-in connector or the working voltage defined for the contact pins. Here, the term working voltage means the voltage which is applied to the contact pins by signals or a power supply. In the case of a working voltage of 14 volts, the breakdown voltage should be approximately at 25 to 30 volts. The material is preferably configured for a breakdown voltage in the range between 25 to 150 volts.

It is possible to prevent an electrostatic discharge directly at components at risk even under unfavorable spatial conditions, since no additional space is required for components. No additional costs arise for components, assembly, printed circuit board area, layout or other structural outlay.

The plug-in connector according to the invention is particularly suitable for electrical igniters which trigger an airbag or a seatbelt pretensioning device in a motor vehicle.

Other features which are considered as characteristic for the invention are set forth in the appended claims.

Although the invention is illustrated and described herein as embodied in a plug-in connector of an electrical device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
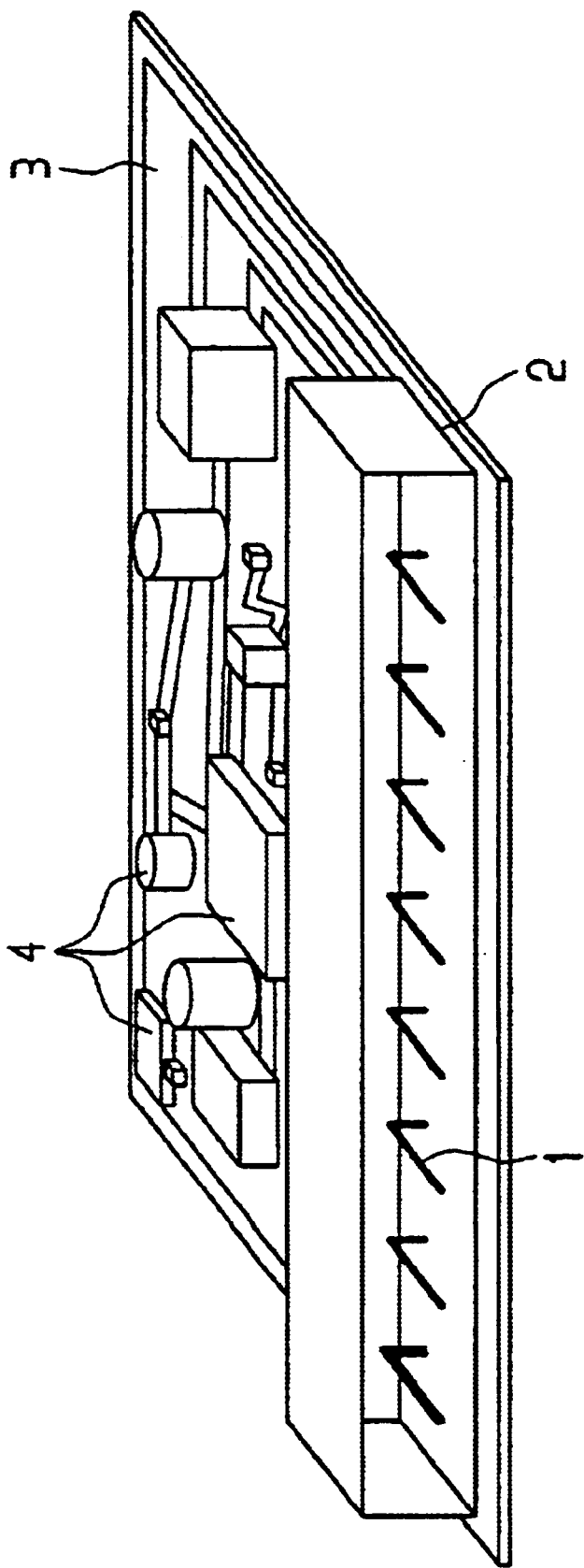
FIG. 1 is a diagrammatic three-dimensional view of an electrical device with a plug-in connector.

Referring now to the figures of the drawings in detail and first, particularly, to FIG. 1 thereof, there is shown an electrical device and, in particular, a control device to be used in automotive technology, with a plug-in connector. The housing of the control device is not illustrated.

The plug-in connector is fastened on a printed circuit board 3. The printed circuit board 3 is fitted with electrical components 4 which are to be protected against an electrostatic discharge.

Figure 2:
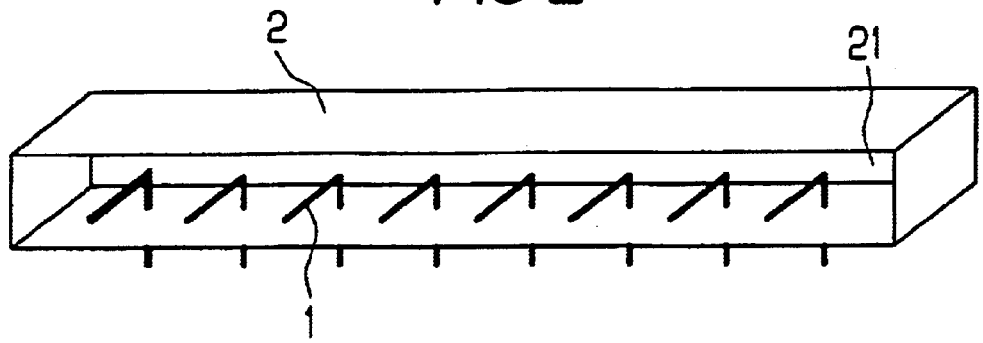
FIG. 2 is a diagrammatic three-dimensional view of a plug-in connector according to the invention.

FIG. 2 shows contact pins 1 which are embedded in a plastic member or plastic body 2 of the plug-in connector.

The contact pins 1 are covered in a form-fitting or form-locking manner along the axes of the contact pins by a material 21 which has conducting properties in a range above 100 volts and has nonconducting properties in a range below 100 volts.

The material 21 can, for example, be a casting resin which is mixed with 7 to 15 percent by weight of carbon powder. In this example, the material 21 is formed of a polymer mixture based on polypropylene and 8.5 percent by weight of carbon powder. The polymer mixture has an electrical surface resistance of approximately 1000 Ohms.

Chips or slivers of stainless steel or high-grade steel can be added to the insulating material instead of carbon powder. In this case, generally no glass fiber components are added to the plastic.

Figure 3:
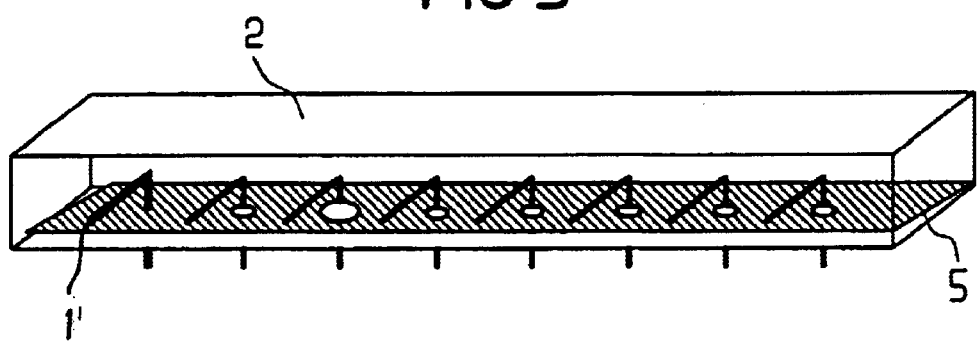
FIG. 3 is a diagrammatic three-dimensional view of a plug-in connector with a conducting surface according to the invention.

A plug-in connector with an additional conducting face or conductive surface 5 is illustrated in FIG. 3. The conductive surface is in this case a metal foil.

Figure 4:
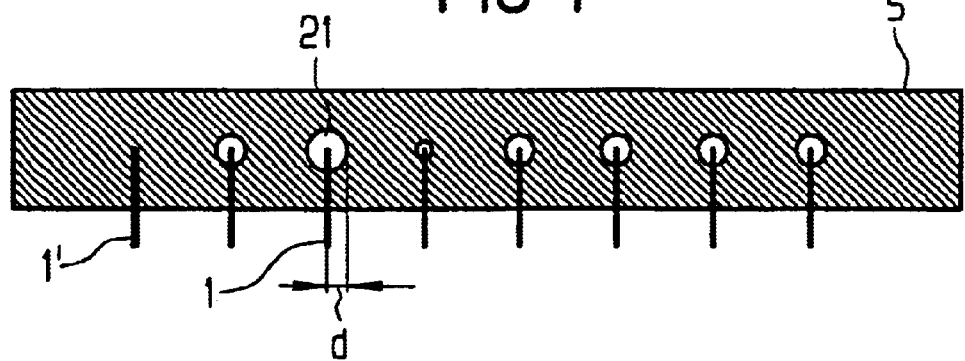
FIG. 4 is a diagrammatic sectional view of the plug-in connector shown in FIG. 3.

FIG. 4 shows the conductive surface 5 with defined spacings d from the contact pins 1. The contact pins 1 are covered in a form-fitting or form-locking manner by the material 21 which is electrically conducting as a function of voltage.

The voltage at which the material 21 becomes conductive can be set via the spacing d. The conductive surface 5 makes electric contact with a contact pin 1' responsible for dissipating the electrostatic charge. Individual spacings d can be set between the contact pins 1 and the conductive surface 5 for the individual contact pins. It is thereby possible to effect different triggering voltages for the individual contact pins in a plug-in connector. In the case of this embodiment, the triggering voltage is a function of the smallest spacing between the contact pin 1 and the conducting surface 5.

The polymer mixture based on propylene with the carbon powder is distinguished by good conductivity when the breakdown voltage is reached, and by small leakage currents. The plug-in connector also has good mechanical properties and is suitable for flow-soldering.

We claim:

1. A plug-in connector for an electrical device, comprising:
    a plastic member including a material being a mixture of a plastic and a carbon powder, having conductive properties at voltages above a given working voltage range and having insulating properties at voltages in the given working voltage range, said plastic member having a conducting surface;
    contact pins embedded in said plastic member, with said material disposed in a form-fitting manner around said contact pins; and
    said conducting surface electrically contacting said material and being disposed at a respective spacing distance from paid contact pins.

2. The plug-in connector according to claim 1, wherein:
    said plastic member includes a base material; and
    said material is a mixture of said base material and a carbon powder.

3. The plug-in connector according to claim 1, wherein:
    said plastic member includes a base material; and
    said material is a mixture of said base material and a carbon powder.

4. The plug-in connector according to claim 1, wherein said material includes between 5 and 15 percent by weight of said carbon powder.

5. The plug-in connector according to claim 1, wherein said plastic member includes a crystalline component and a noncrystalline component.

6. In combination with an electrical device having electrical components, a plug-in connector, comprising:
    a plastic member including a material being a mixture of a plastic and a carbon powder, having conductive properties at voltages above a given working voltage range and having insulating properties at voltages in the given working voltage range, said plastic member having a conducting surface;
    contact pins embedded in said plastic member, with said material disposed in a form-fitting manner around said contact pins: and
    said conducting surface electrically contacting said material and being disposed at a respective spacing distance from said contact pins.

7. The plug-in connector according to claim 6, wherein:
    said plastic member includes a base material; and
    said material is a mixture of said base material and a carbon powder.

8. The plug-in connector according to claim 6, wherein:
    said plastic member includes a base material; and
    said material is a mixture of said base material and a carbon powder.

9. The plug-in connector according to claim 6, wherein said material includes between 5 and 15 percent by weight of said carbon powder.

10. The plug-in connector according to claim 6, wherein said plastic member includes a crystalline component and a non-crystalline component.

* * * * *